(12) United States Patent
Koh et al.

(10) Patent No.: US 9,417,520 B2
(45) Date of Patent: Aug. 16, 2016

(54) METHODS OF PATTERNING BLOCK COPOLYMER LAYERS AND PATTERNED STRUCTURES

(71) Applicant: SAMSUNG ELECTRONICS CO., LTD., Suwon-si, Gyeonggi-do (KR)

(72) Inventors: Haeng Deog Koh, Hwaseong-si (KR); Mi-Jeong Kim, Hwaseong-si (KR); In Taek Han, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/171,919

(22) Filed: Feb. 4, 2014

(65) Prior Publication Data

US 2014/0234589 A1    Aug. 21, 2014

(30) Foreign Application Priority Data

Feb. 18, 2013  (KR) ........................ 10-2013-0017103

(51) Int. Cl.
*H01L 21/3105* (2006.01)
*G03F 7/00* (2006.01)

(52) U.S. Cl.
CPC ....... *G03F 7/0002* (2013.01); *Y10T 428/24802* (2015.01)

(58) Field of Classification Search
USPC ...................................... 430/273.1, 328, 330
See application file for complete search history.

(56) References Cited

U.S. PATENT DOCUMENTS

| 7,521,090 | B1 | 4/2009 | Cheng et al. |
| 7,989,026 | B2 | 8/2011 | Cheng et al. |
| 8,226,838 | B2 | 7/2012 | Cheng et al. |
| 2010/0124629 | A1 | 5/2010 | Gopalan et al. |
| 2011/0014420 | A2 | 1/2011 | Gopalan et al. |
| 2011/0104401 | A1 | 5/2011 | Ho et al. |
| 2012/0116007 | A1 | 5/2012 | Gopalan et al. |

FOREIGN PATENT DOCUMENTS

| KR | 100996911 B1 | 11/2010 |
| KR | 1020110018678 A | 2/2011 |
| KR | 101133861 B1 | 4/2012 |
| TW | 201102403 A | 1/2011 |

OTHER PUBLICATIONS

Cheng, et al., "Integration of Polymer Self-Assembly for Lithographic Application," Proc. of SPIE vol. 6921, 692127, 2008, 8 pages.
Huang, et al., "Neutrality Conditions for Block Copolymer Systems on Random Copolymer Brush Surfaces," Macromolecules, 1999, 32, pp. 5299-5303.
Knudsen, et al., "Creating Microstructures on SiliconWafers Using UV-Crosslinked Polystyrene This Films," Polymer Engineering and Science, 49, 2009, pp. 945-948.
Lei Li, et al., "Fabrication of robust honeycomb polymer films: A facile photochemical cross-linking process," Journal of Colloid and Interface Science 331, 2009, pp. 446-452.
Rui Guo, et al., "Perpendicular orientation of microdomains in PS-b-PMMA thin films on the PS brushed substrates," Soft Matter, 2011, 7, pp. 6920-6925.
Yeon Sik Jun, et al., "Orientation-Controlled Self-Assembled Nanolithography Using a Polystyrene-Polydimethylsiloxane Block Copolymer," Nano Letters, vol. 7, No. 7, 2007, pp. 2046-2050.

*Primary Examiner* — Daborah Chacko Davis
(74) *Attorney, Agent, or Firm* — Cantor Colburn LLP (57) ABSTRACT

A method of patterning a block copolymer layer, the method including:
  providing a substrate including a topographic pattern on a surface of the substrate, wherein the topographic pattern includes a trench and a mesa;
  forming, on the surface of the substrate, an underlayer including a polymer, wherein the polymer includes a repeating unit derived from a substituted or unsubstituted aromatic vinyl monomer and has an anchoring group;
  heat-treating the underlayer to anchor the underlayer to the surface of the substrate via the anchoring group;
  irradiating the heat-treated underlayer with light to form a crosslinked polymer with a crosslink between carbon atoms of main chains of the polymer;
  forming a block copolymer layer on the underlayer including the crosslinked polymer; and
  heat-treating the block copolymer layer to form a self-assembled structure of the block copolymer directed by the topographic pattern.

15 Claims, 6 Drawing Sheets

METHODS OF PATTERNING BLOCK COPOLYMER LAYERS AND PATTERNED STRUCTURES

CROSS-REFERENCE TO RELATED APPLICATION

This application claims priority to and the benefit of Korean Patent Application No. 10-2013-0017103, and all the benefits accruing therefrom under 35 U.S.C. §119, the content of which is incorporated herein in its entirety by reference.

BACKGROUND

1. Field

A method of patterning a block copolymer layer and a patterned structure are disclosed.

2. Description of the Related Art

Recently, in view of a decrease in a size of electronic devices and an increase in an integration degree of semiconductor devices, a demand for lithography technology for forming a fine nano-sized pattern for fabricating a semiconductor memory or a logic circuit has increased. Typically, conventional photolithography technologies suffer from difficulties in realizing a nano-sized fine pattern, in particular, a nano-pattern of less than or equal to about 20 nm, due to the wavelength resolution limit. Accordingly, various methods based on new principles of fabricating nano-sized patterns have been researched. One of these methods utilizes a self-assembled nano-structure.

A block copolymer is a type of a polymeric material that may be self-assembled to form a nano-structure. The molecular structure of the block copolymer typically includes chemically different polymer blocks connected to one another through a covalent bond. Such polymer blocks may be self-assembled to form various repeating nano-sized structures such as a sphere, a cylinder, and a lamella with a period of about 5 to about 50 nm. The resulting nano-structures are usually thermodynamically stable, and in the process of synthesizing the block copolymer, the size and properties of the nanostructure may be controlled, for example, via changing the monomer types, the ratio between the monomers, and a molecular weight of the polymer. Vertical lamella or horizontal cylinder structures prepared from a block copolymer film may become directed self-assembled structures via chemical epitaxy or graphoepitaxy. In the process of directed self-assembly of the block copolymer, the orientation or the direction of the lamella or cylinder structures may be controlled by adjusting the surface energy of the underlying substrate. Selectively etching/removing a certain type of blocks in the block copolymers from such structures enables the formation of a desired pattern, which may be used in the next generation lithography. Thus, there remains a need for a specific patterning method utilizing a directed self-assembly of a block polymer.

SUMMARY

An embodiment provides a patterning method using directed self-assembly of a block copolymer, wherein an underlayer is provided on a surface of a substrate to control a direction and orientation of a block copolymer structure, thereby forming a nano-pattern having a desired direction/orientation.

Another embodiment provides a nano-structure patterned by the foregoing method.

An embodiment provides a method of patterning a block copolymer layer, the method including:

providing a substrate including a topographic pattern on a surface of the substrate, wherein the topographic pattern includes a trench and a mesa;

forming, on the surface of the substrate, an underlayer including a polymer, wherein the polymer includes a repeating unit derived from a substituted or unsubstituted aromatic vinyl monomer and has an anchoring group;

heat-treating the underlayer to anchor the underlayer to the surface of the substrate via the anchoring group;

irradiating the heat-treated underlayer with light to form a crosslinked polymer with a crosslink between carbon atoms of main chains of the polymer;

forming a block copolymer layer on the underlayer including the crosslinked polymer; and heat-treating the block copolymer layer to form a self-assembled structure of the block copolymer directed by the topographic pattern.

The polymer in the underlayer may be a copolymer further including a repeating unit derived from a non-aromatic vinyl monomer.

The non-aromatic vinyl monomer may be selected from a substituted or unsubstituted C1 to C10 alkyl(meth)acrylate, a substituted or unsubstituted C6 to C20 aryl(meth)acrylate, butadiene, isoprene, or a combination thereof.

The polymer in the underlayer may include a repeating unit derived from a vinyl monomer including a substituted or unsubstituted benzene moiety, a substituted or unsubstituted naphthalene moiety, a substituted or unsubstituted anthracene moiety, a substituted or unsubstituted pyridine moiety, a substituted or unsubstituted pyrrole moiety, a substituted or unsubstituted furan moiety, or a substituted or unsubstituted thiophene moiety.

The polymer included in the underlayer may include a repeating unit derived from a substituted or unsubstituted styrene, a substituted or unsubstituted vinylnaphthalene, a substituted or unsubstituted vinylanthracene, a substituted or unsubstituted vinylpyridine, a substituted or unsubstituted vinylpyrrole, a substituted or unsubstituted vinylfuran, a substituted or unsubstituted vinylthiophene, or a combination thereof.

The polymer included in the underlayer may include a repeating unit derived from styrene, a C1 to C10 alkyl substituted styrene, a halogen-substituted styrene, 1-vinylpyrrole, 2-vinylpyrrole, 3-vinylpyrrole, 2-vinylpyridine, 4-vinylpyridine, 2-vinylfuran, 3-vinylfuran, 2-vinylthiophene, 3-vinylthiophene, or a combination thereof.

The polymer included in the underlayer may be a homopolymer, a random copolymer, or a block copolymer.

The polymer included in the underlayer may be a hydroxy-terminated polystyrene, a hydroxy-terminated poly(methylstyrene), a hydroxy-terminated poly(ethylstyrene), a hydroxy-terminated poly(4-t-butylstyrene), a hydroxy-terminated poly(chlorostyrene), a hydroxy-terminated poly(2-vinylpyridine), a hydroxy-terminated poly(4-vinylpyridine), a hydroxy-terminated poly(1-vinylpyrrole), a hydroxy-terminated poly(2-vinylpyrrole), a hydroxy-terminated poly(vinylpyrrole), a hydroxy-terminated poly(methylmethacrylate-co-styrene) random copolymer, a hydroxy-terminated poly(styrene-co-vinylpyridine) random copolymer, a hydroxy-terminated poly(methylmethacrylate-co-vinylpyridine) random copolymer, or a combination thereof.

The anchoring group may be a hydroxyl group, a thiol group, an azide group, a carboxylic acid group, an amide group, an amine group, an epoxy group, or a trichlorosilane group.

The heat-treating the underlayer may be conducted at a temperature of greater than or equal to about 80° C. for about 30 minutes or longer.

The method may further include washing the heat-treated underlayer with an organic solvent prior to the irradiating the heat-treated underlayer with light.

The organic solvent may include a C6 to C20 aromatic hydrocarbon, a C5 to C10 aliphatic hydrocarbon, a ketone, or a combination thereof.

The light in the irradiating the heat-treated underlayer may be a UV light having a wavelength of shorter than or equal to about 300 nanometers.

The irradiating the heat-treated underlayer with light may be conducted at a light intensity of greater than or equal to about 10 Joules/centimeter$^2$.

The block copolymer may include a block copolymer including a first repeating unit including styrene or a derivative thereof and a second repeating unit including (meth)acrylic acid ester, a block copolymer including a first repeating unit including styrene or a derivative thereof and a second repeating unit including siloxane or a derivative thereof, a block copolymer including a first repeating unit including styrene or a derivative thereof and a second repeating unit including an olefin, or a block copolymer including a first repeating unit including styrene or a derivative thereof and a second repeating unit including an alkylene oxide.

The block copolymer self-assembled by the heat-treating of the block copolymer layer may include a cylinder structure parallel to the substrate or a lamella structure perpendicular to the substrate.

A thickness of the block copolymer layer may be greater than or equal to 15 nanometers so that a self-assembled structure of the block copolymer may be directed by the topographic pattern both in the trench and on the mesa.

A thickness of the underlayer may be substantially equal to a depth of the trench so that a self-assembly of the block copolymer may be directed in a direction orthogonal to the topographic pattern.

Other embodiments provide a patterned polymer structure including a substrate, an underlayer disposed on a surface of the substrate, and a block copolymer layer patterned on the underlayer, wherein the underlayer includes a crosslinked polymer including a repeating unit derived from an aromatic vinyl monomer including a substituted or unsubstituted simple or heterogeneous aromatic ring and being linked to the substrate via an anchoring group, and wherein the crosslinked polymer includes a crosslink between carbon atoms of a main chain of the polymer.

When a pattern is formed by a directed self-assembly of block copolymers, it is possible to realize a self-assembled block copolymer pattern with a higher orientation degree and a lower defect number by providing an underlayer that has an easily controllable thickness and is made of more affordable materials.

BRIEF DESCRIPTION OF THE DRAWINGS

These and/or other aspects will become apparent and more readily appreciated from the following description of the embodiments, taken in conjunction with the accompanying drawings in which:

FIGS. 5(A) and (B) are SEM images of directed self-assembly products of PS-PMMA formed not only in the trench but also on the mesa in accordance with Example 4.

DETAILED DESCRIPTION

Advantages and characteristics of this disclosure and a method for achieving the same will become evident referring to the following exemplary embodiments together with the drawings attached hereto. However, this disclosure may be embodied in many different forms and is not to be construed as limited to the embodiments set forth herein; rather, these embodiments are provided so that this disclosure will satisfy applicable legal requirements. Therefore, in some embodiments, well-known process technologies are not explained in detail in order to avoid vague interpretation of the present disclosure. Unless otherwise mentioned, all terms in the specification (including technical and scientific terms) may be commonly understood by one skilled in the art pertaining by the present disclosure. Terms defined in a generally-used dictionary are not to be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

The embodiments are merely described below, by referring to the figures, to explain aspects of the present description. As used herein, the term "and/or" includes any and all combinations of one or more of the associated listed items. The term "or" means "and/or." Expressions such as "at least one of," when preceding a list of elements, modify the entire list of elements and do not modify the individual elements of the list.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Additional aspects will be set forth in part in the description which follows and, in part, will be apparent from the description.

As used herein, the term "topographic pattern" refers to a pattern including trenches and mesas repeating with a period when being seen in a cross-sectional direction of a substrate.

As used herein, the term "substituted or unsubstituted aromatic vinyl monomer" refers to a vinyl monomer having a substituted or unsubstituted simple or heterogeneous aromatic ring.

As used herein, the term "substituted" refers to replacement of at least one hydrogen in a corresponding moiety with a C1 to C10 alkyl group, a halogen group, or a C6 to C20 aryl group.

As used herein, the term "simple aromatic ring" refers to a hydrocarbon aromatic ring.

As used herein, the term "heterogeneous aromatic ring" refers to an aromatic ring that includes at least one heterogeneous element (i.e., an element other than carbon) such as nitrogen (N), oxygen (O), sulfur (S), phosphorus (P), or a combination thereof.

As used herein, the term "alkyl" refers to a monovalent or higher valency group derived from a completely saturated, branched or unbranched (or a straight or linear) hydrocarbon, and having the specified number of carbon atoms.

As used herein, the term "halogen atom" refers to fluorine, bromine, chlorine, or iodine.

As used herein, the term "aryl" group, which is used alone or in combination, refers to a monovalent group derived from an aromatic hydrocarbon containing at least one ring, and having the specified number of carbon atoms. As used herein, the term "aryl" includes a group with an aromatic ring fused to at least one cycloalkyl ring.

In an embodiment, a method of patterning a block copolymer layer includes:

providing a substrate including a topographic pattern on a surface of the substrate, wherein the topographic pattern includes a trench and a mesa;

forming, on the surface of the substrate, an underlayer including a polymer, wherein the polymer includes a repeating unit derived from a substituted or unsubstituted aromatic vinyl monomer and has an anchoring group;

heat-treating the underlayer to anchor the underlayer to the surface of the substrate via the anchoring group;

irradiating the heat-treated underlayer with light to form a crosslinked polymer with a crosslink between carbon atoms of main chains of the polymer;

forming a block copolymer layer on the underlayer including the crosslinked polymer; and heat-treating the block copolymer layer to form a self-assembled structure of the block copolymer directed by the topographic pattern.

The topographic pattern may be fabricated on a suitable substrate by any suitable method. Such patterning methods may include top-down patterning such as lithography, bottom-up assembly, or a combination thereof. For example, preparing the topographic pattern may utilize X-ray lithography, extreme ultraviolet ("UV") lithography, electron beam lithography, photolithography, or interference lithography. A non-limiting example of the formation of the topographic pattern may involve obtaining a groove pattern of a square waveform profile with a predetermined depth by using interference lithography and ion etching. Alternatively, the preparation of the topographic pattern may involve forming a pattern of a positive or negative photoresist through the exposure and development to provide a trench on a substrate.

In the patterning method, any type of substrate may be used. For example, the substrate may include a polymer, a metal (including its alloys), a metal oxide, or a metal nitride in a semiconductor field wherein the block copolymer may be used as a resist mask for a subsequent process. Examples of the substrate may include, but are not limited to, a metal or a metalloid such as silicon, copper, chromium, iron, aluminum, hafnium, or gallium, an oxide or nitride thereof (e.g., silicon oxide, hafnium oxide, aluminum oxide, or silicon nitride), glass, polyethylene, polyethylene terephthalate, or polyimide.

The polymer included in the underlayer may be a polymerization product of an aromatic vinyl monomer with a substituted or unsubstituted simple or heterogeneous aromatic ring. As used herein, the term "aromatic vinyl monomer" refers to a monomer having a carbon-carbon double bond and an aromatic ring directly linked to a carbon atom of a carbon-carbon double bond. For example, the aromatic ring may be a substituted or unsubstituted benzene moiety, a substituted or unsubstituted naphthalene moiety, a substituted or unsubstituted anthracene moiety, a substituted or unsubstituted pyridine moiety, a substituted or unsubstituted pyrrole moiety, a substituted or unsubstituted furan moiety, or a substituted or unsubstituted thiophene moiety. The aromatic ring may be a 5-membered or 6-membered ring. In a certain embodiment, the aromatic vinyl monomer may be a substituted or unsubstituted styrene, a substituted or unsubstituted vinylnaphthalene, a substituted or unsubstituted vinylanthracene, a substituted or unsubstituted vinylpyridine, a substituted or unsubstituted vinylpyrrole, a substituted or unsubstituted vinylfuran, a substituted or unsubstituted vinylthiophene, or a combination thereof. If desired, the polymer may further include at least one non-aromatic vinyl monomer in addition to the aromatic vinyl monomer. Examples of the non-aromatic vinyl monomer may include, but are not limited to, a substituted or unsubstituted C1 to C10 alkyl(meth)acrylate, a substituted or unsubstituted C6 to C20 aryl(meth)acrylate, butadiene, or isoprene. The polymer that forms the underlayer may include a repeating unit derived from styrene, a styrene substituted with a C1 to C10 alkyl group, a halogen-substituted styrene, 1-vinylpyrrole, 2-vinylpyrrole, 3-vinylpyrrole, 2-vinylpyridine, 4-vinylpyridine, 2-vinylfuran, 3-vinylfuran, 2-vinylthiophene, 3-vinylthiophene, or a combination thereof. The polymer that forms the underlayer may be a homopolymer, a random copolymer, or a block copolymer. In a certain embodiment, the polymer that forms the underlayer may be a homopolymer or a random copolymer.

Examples of the polymer contained in the underlayer may include, but are not limited to, a hydroxy-terminated polystyrene, a hydroxy-terminated poly(methylstyrene), a hydroxy-terminated poly(ethylstyrene), a hydroxy-terminated poly(4-t-butylstyrene), a hydroxy-terminated poly(chlorostyrene), a hydroxy-terminated poly(2-vinylpyridine), a hydroxy-terminated poly(4-vinylpyridine), a hydroxy-terminated poly(1-vinylpyrrole), a hydroxy-terminated poly(2-vinylpyrrole), a hydroxy-terminated poly(methylmethacrylate-co-styrene) random copolymer, a hydroxy-terminated poly(styrene-co-vinylpyridine) random copolymer, a hydroxy-terminated poly(methylmethacrylate-co-vinylpyridine) random copolymer, and a hydroxy-terminated poly(benzylpropylmethacrylate-co-styrene) random copolymer.

The anchoring group may be a hydroxyl group (—OH), a thiol group (—SH), an azide group (—N$_3$), a carboxylic acid group (—CO$_2$H), an amide group (—C(=O)NH$_2$), an amine group (—NH$_2$), an epoxy group (—C$_2$H$_3$O), or a trichlorosilane group (—SiCl$_3$). The anchoring group may be disposed at an end of the polymer.

Various types of the polymer contained in the underlayer may be suitably selected on the basis of a block copolymer composition, a desired pattern shape, and a desired surface property (e.g., a preferential or neutral surface). For example, when a polystyrene-polymethylmethacrylate ("PS-PMMA") block copolymer is selected to form a horizontal cylinder structure on a substrate, it may be desired to form a surface preferential to polystyrene, and thus, for example, a hydroxyl terminated polystyrene may be used. Alternatively, when a polystyrene-polymethyl methacrylate ("PS-PMMA") block copolymer is selected to form a vertical lamella structure on a substrate, it may be desired to form a neutral surface, and thus, for example, a hydroxyl terminated polystyrene-PMMA random copolymer may be used.

Heat-treating the underlayer may trigger a reaction between the substrate and the anchoring group, which for example, may be present at an end of the polymer, resulting in the anchoring of the underlayer to the substrate. The time and the temperature of the heat-treating of the underlayer may be suitably selected. For example, the heat-treating may be carried out at a temperature of greater than or equal to about 80° C., e.g., greater than or equal to about 100° C., greater than or equal to about 120° C., or greater than or equal to about 150° C., for about 30 minutes or longer, e.g., for about one to about 24 hours, for about 2 to about 20 hours, or for about 6 hours or longer, but the temperature and time of heat-treating are not limited thereto. The atmosphere for the heat treating may also be suitably selected. For example, the heat treating may be conducted in air or in an inert gas atmosphere.

The method may further include washing the heat-treated underlayer with an organic solvent prior to irradiating the heat-treated underlayer with light (e.g., irradiating with a UV light). The washing with an organic solvent makes it possible to remove the polymer not being anchored to the substrate. Types of the organic solvent may include, but are not limited to, an aromatic hydrocarbon such as toluene, an aliphatic hydrocarbon such as hexane, a ketone such as methylethyl ketone, or a combination thereof. Such washing step may, however, be omitted in order to obtain a desired thickness of the underlayer.

The heat-treated (and optionally washed with an organic solvent) underlayer may be irradiated with light. In a certain embodiment, the heat-treated underlayer is irradiated with a UV light having a wavelength of less than or equal to 300 nanometers ("nm"), for example, less than or equal to 280 nm, less than or equal to 270 nm, less than or equal to 265 nm, or less than or equal to 255 nm. As used herein, the term "UV light" is a light having a wavelength of less than or equal to 300 nm, less than or equal to 280 nm, less than or equal to 270 nm, less than or equal to 265 nm, or less than or equal to 255 nm. During the irradiating, the light intensity may be greater than or equal to 10 Joules per square centimeter ("J/cm$^2$"), for example, greater than or equal to 18 J/cm$^2$, or greater than or equal to 20 J/cm$^2$.

The irradiating with light (e.g., a UV light) may trigger a reaction to generate intermolecular crosslinking between carbon atoms of the main chains (e.g., between a carbon atom of a main chain and a carbon atom of another main chain) of the polymer having an aromatic ring moiety contained in the underlayer, enabling the formation of the crosslinked polymer. Without being bound by any theory, when the underlayer is exposed to a UV light, a C—H bond at the carbon atom having the aromatic ring in the polymer main chain is cleaved to form a free radical. Macro-radicals thus formed may migrate along the polymer until they are trapped by other free radicals or by impurities. When macro-radicals formed in two neighboring polymer main chains are sufficiently close to each other, the intermolecular cross-linking may occur. As a non-limiting example given merely for the purpose of understanding, a crosslinking reaction mechanism for polystyrene may be illustrated by Reaction Scheme 1.

Reaction Scheme 1

The underlayer such as a polymer brush may be used for the purpose of directing the self-assembled structure of the block copolymer in a desired orientation or arrangement. The polymer brush being applied to the substrate may bring about a neutral surface to which the components constituting the block copolymer shows a substantially equal degree of preference. Alternatively, the polymer brush being applied to the substrate may bring about a preferential surface to which one of the components constituting the block copolymer has a higher degree of preference than the other. Various types of the polymer brush may be chosen depending on a desired shape of the self-assembled structure of the block copolymer (e.g., a horizontal cylinder or a vertical lamella) and the block copolymer composition being used. Examples of the currently available polymer brush materials may include a hydroxyl terminated polystyrene ("PS-OH"), a hydroxyl terminated polydimethylsiloxane ("PDMS-OH"), or a hydroxyl terminated poly-2-vinylpyrrolidone. In a conventional method using the polymer brush, a film of any given type of a polymer brush is formed on a substrate, which is subsequently heat-treated to anchor itself to the surface of the substrate via anchoring groups such as a hydroxyl group. Then, the resulting product is subjected to solvent-washing to remove unreacted brush. However, it is practically impossible to achieve a complete removal of the unreacted polymer brush. When a block copolymer is coated onto the underlayer with such an unreacted brush remaining thereon and subsequently subjected to a directed self-assembly process, the unreacted brush which is not anchored to the surface is often intermixed with the block copolymer, leading to inconsistent values of critical dimensions of a pattern, a lower degree of orientation, and an increased number of defects in the nanopattern thus obtained. In particular, it is virtually impossible to form a film with a desired thickness.

In contrast, in the patterning method in accordance with the embodiment, the underlayer including the polymer is anchored to a substrate, and is subsequently irradiated with a UV light to form crosslinkings between the carbon atoms of the main chains of the polymer. As a result, the film becomes chemically anchored to the surface of the substrate to secure the stability of the film. Such crosslinkings make it possible to control the thickness of the film with ease and consistency, and the film thus obtained may possess a uniform thickness and a relatively smooth surface. In addition, controlling the light intensity of the UV light makes it possible to adjust the crosslinking degree of the underlayer polymer, thus enabling tuning of the surface energy of the resulting film.

Figure 1:
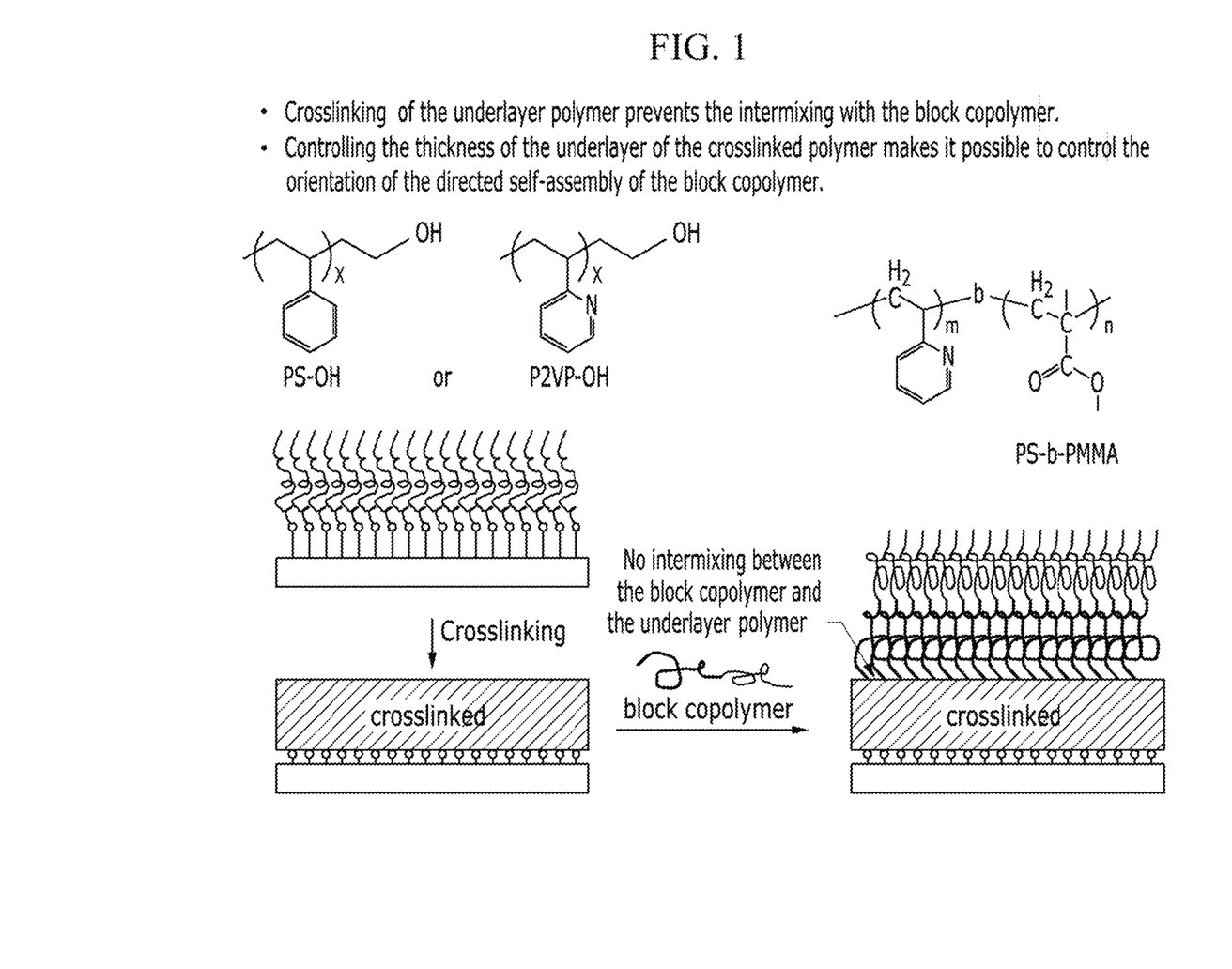
FIG. 1 is a view schematically illustrating an underlayer hardening effect in an embodiment of a patterning method.

Unlike using conventional methods, when the block copolymer layer is formed on the underlayer including the crosslinked polymer, it becomes possible to prevent the block copolymer from being intermixed with the underlayer polymer. A hardening effect of the underlayer polymer is schematically illustrated in FIG. 1. By virtue of the hardening effect, the directed self-assembly pattern of the block copolymer may show relatively constant critical dimensions, a high degree of orientation, and a decreased number of defects. Further, the thickness of the underlayer including the crosslinked polymer may be controlled, and thereby the orientation and the direction of the directed self-assembly structure of the block copolymer may also be controlled, as further described below.

The patterning method further includes forming a block copolymer layer on the underlayer of the crosslinked polymer and heat-treating the block copolymer layer to form a self-assembled structure of the block copolymer directed to the topographic pattern.

As the block copolymer, it is possible to use any copolymer that may be microphase-separated by self-assembly, and its types are not particularly limited. Examples of the block copolymer may include, but are not limited to, a block copolymer including a first repeating unit including styrene or a derivative thereof and a second repeating unit including (meth)acrylic acid ester, a block copolymer including a first repeating unit including styrene or a derivative thereof and a second repeating unit including siloxane or a derivative thereof, a block copolymer including a first repeating unit including styrene or a derivative thereof and a second repeating unit including an olefin monomer, a block copolymer including a first repeating unit including styrene or a derivative thereof and a second repeating unit including an alkylene oxide, and a block copolymer including a first repeating unit including an alkylene oxide and a second repeating unit including (meth)acrylic acid ester. The block copolymer may include at least two polymer components. The block copolymer may be used alone or in combination of at least two types of the block copolymers.

Examples of the (meth)acrylic acid ester may include, but are not limited to, (meth)acrylic acid methyl ester, (meth)acrylic acid ethyl ester, (meth)acrylic acid propyl ester, (meth)acrylic acid cyclohexyl ester, (meth)acrylic acid octyl ester, (meth)acrylic acid hydroxyethyl ester, (meth)acrylic acid hydroxypropyl ester, (meth)acrylic acid benzyl ester, (meth)acrylic acid anthracene ester, (meth)acrylic acid glycidyl ester, (meth)acrylic acid 3,4-epoxycyclohexylmethane ester, or (meth)acrylic acid propyl trimethoxysilane ester.

Examples of the styrene derivative may include, but are not limited to, alpha-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrrolidone, 9-vinylanthracene, 2-vinylpyridine, 3-vinylpyridine, or 4-vinylpyridine.

Examples of the siloxane derivative may include, but are not limited to, dimethylsiloxane, diethylsiloxane, diphenylsiloxane, or methylphenylsiloxane.

Examples of the alkylene oxide may include, but are not limited to, ethylene oxide, propylene oxide, or butylene oxide.

Examples of the block copolymer may include, but are not limited to, a polystyrene-polymethylmethacrylate block copolymer ("PS-b-PMMA"), a polystyrene-polymethylacrylate block copolymer, a polystyrene-polyethylmethacrylate block copolymer, a polystyrene-poly-t-butyl methacrylate block copolymer, a polystyrene-polymethacrylic acid block copolymer, a polystyrene-polybutoxymethacrylate block copolymer, a polystyrene-polyethylacrylate block copolymer, a polystyrene-polyacrylic acid block copolymer, a polystyrene-polybutadiene block copolymer ("PS-b-PBD"), a polystyrene-polyisoprene block copolymer ("PS-b-PI"), a polystyrene-polyethylenepropylene block copolymer ("PS-b-PEP"), a polystyrene-polydimethylsiloxane block copolymer ("PS-b-PDMS"), a polystyrene-polyethylene block copolymer ("PS-b-PE"), a polystyrene-polyvinylpyridine copolymer ("PS-b-P4VP"), and a polystyrene-polyethylene oxide block copolymer ("PS-b-PEO"), a polyethylene oxide-polyisoprene block copolymer ("PEO-b-PI"), a polyethylene oxide-polybutadiene block copolymer ("PEO-b-PBD"), a polyethylene oxide-polymethylmethacrylate block copolymer ("PEO-b-PMMA"), a polyethylene oxide-polyethylene ethylene block copolymer ("PEO-b-PEE"), a polystyrene-polyferrocyanyldimethylsilane block copolymer ("PS-b-PFS"), a polybutadiene-polyvinylpyridine block copolymer ("PBD-b-PVP"), a polyisoprene-polymethylmethacrylate block copolymer ("PI-b-PMMA"), and a poly-2-vinylpyridine-polydimethylsiloxane block copolymer ("P2VP-b-PDMS").

The weight average molecular of the block copolymer is not particularly limited, and may range from about 5,000 to about 500,000, for example, about 5,000 to about 300,000, about 5,000 to about 100,000, or about 5,000 to about 50,000.

The block copolymer designed to have a proper molar ratio between the components of the block copolymer may be microphase-separated into a plurality of discrete domains when it is heat-treated at a predetermined temperature. For example, an A-b-B copolymer layer may be microphase-separated into discrete domains of a polymer A (hereinafter referred to as $P_A$) and discrete domains of a polymer B (hereinafter referred to as $P_B$). The heat-treating temperature may be properly chosen depending on the block copolymer used. For example, the heat-treating may be performed at a temperature higher than or equal to the glass transition temperature of the block copolymer and lower than the thermal decomposition temperature thereof. According to a non-limiting example, the heat-treating may be performed at a temperature of about 150° C. to about 350° C. In addition, the time for heat-treating is not particularly limited, for example, may be performed for about 1 minute to about 3-4 days, e.g., from about 30 minutes to about 20 hours. The period of discrete domains as microphase-separated $\lambda_o$ is not particularly limited, and for example, may range from about 5 to about 100 nm. The shape of the discrete domains formed by self-assembly of the block copolymer may be determined depending on the molecular weight ratio between the polymer components constituting the block copolymer. For example, when the block copolymer includes the first polymer component (e.g., polystyrene) and the second polymer component (e.g., polymethylmethacrylate) that are immiscible with each other, the discrete domains formed by self-assembly may have a lamella pattern as the ratio between the first and second polymer components ranges from about 40:60 to about 60:40, while the discrete domains formed through a self-assembly may form a cylinder pattern as the ratio between the first and second polymer components ranges from about 20:80 to about 35:65.

When the block copolymer layer formed on the underlayer including the crosslinked polymer has a thickness of greater than or equal to about 15 nm, for example, about 30 nm to about 50 nm, it is possible to direct the self-assembly of the block copolymer in accordance with the topographic pattern not only in the trench but also on the mesa. In other words, the self-assembly of the block copolymer may be directed in a constant direction over the entire surface of the topographic pattern. In addition, when the thickness of the underlayer is adjusted to be substantially equal to the depth of the trench, the self-assembly of the block copolymer may be directed in a direction orthogonal to the topographic pattern. As used herein, "adjusting the thickness of the underlayer to be substantially equal to the depth of the trench" refers to "controlling the thickness of the underlayer within the trench depth±about 10%.

The patterning method may further include selectively removing some of the discrete domains of the block copolymer. Some of the discrete domains (e.g., $P_A$ or $P_B$) may be removed by any suitable method. Methods for the selective removal are not particularly limited, but they may be suitably selected depending on the components of the discrete domains. For example, it is possible to use oxygen plasma, ozone treatment, UV irradiation treatment, thermal decomposition, chemical decomposition, or a combination thereof.

Another embodiment provides a patterned polymer structure including a substrate, an underlayer disposed on a surface of the substrate, and a block copolymer layer patterned on the underlayer. The underlayer includes a crosslinked polymer including a repeating unit derived from an aromatic vinyl monomer with a substituted or unsubstituted simple or heterogeneous aromatic ring and being linked to the substrate via an anchoring group, and the crosslinked polymer includes crosslinkings between carbon atoms of main chains of the polymer. The block copolymer layer may be patterned according to any of the aforementioned patterning methods. Details for the underlayer and the patterning method are the same as set forth above and will not be discussed herein.

Hereinafter, the embodiments are illustrated in greater detail with a reference to examples. However, these are only exemplary embodiments, and the present disclosure is not limited thereto.

EXAMPLES

Example 1

Figure 2:
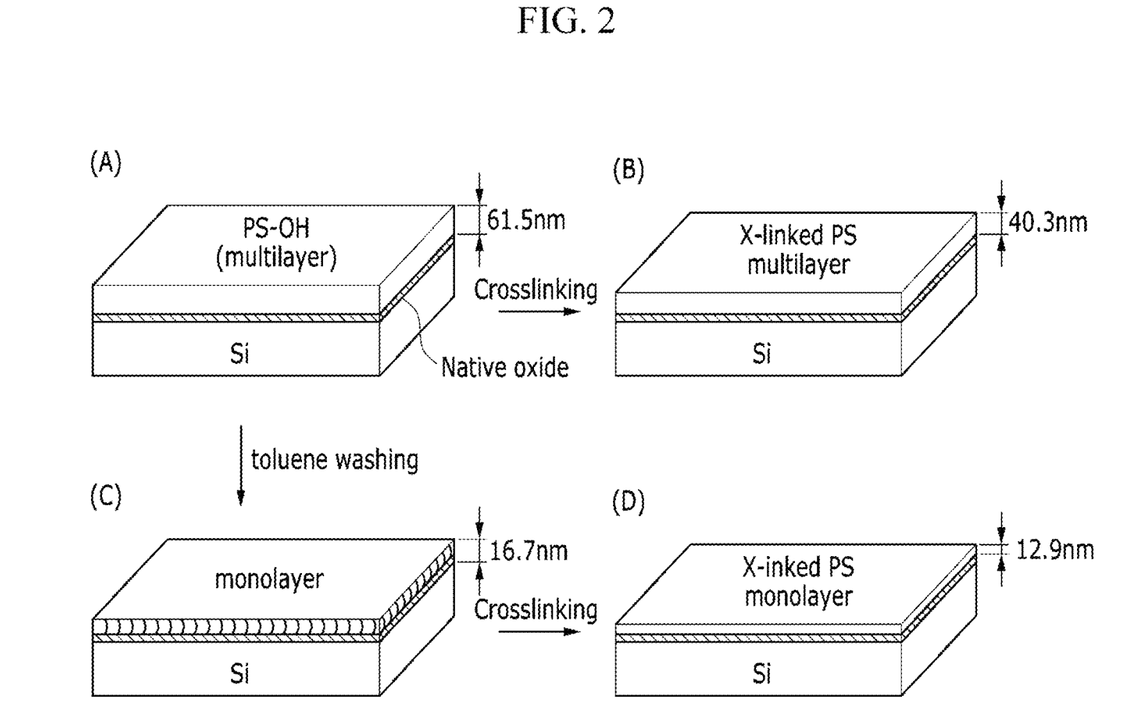
FIG. 2 is a view schematically illustrating a thickness change of an underlayer film via a UV-induced crosslinking in Example 1.

Preparation of the Underlayer Via Light-Induced Crosslinking (1) An 8-inch silicon wafer substrate is cleaned, and then a toluene solution of a hydroxyl-terminated polystyrene (hereinafter, PS-OH, molecular weight: 33 kilogram per mole ("kg/mol"), purchased from Polymer Science, Inc.) having a concentration of 1.0 weight % is spin-coated thereon at 500 rounds per minute ("rpm") and is heat-treated at a temperature of 150° C. for 6 hours to prepare a polymer film on the wafer with a thickness of 61.5 nm (see FIG. 2(A)).

(2) The film thus obtained is exposed to a UV light having a wavelength of about 254 nm at a light intensity of 20 J/cm$^2$ to obtain a crosslinked polymer film. The thickness of the crosslinked polymer film thus obtained is 40.3 nm (see FIG. 2(B)). The film having a plurality of layers of PS-OH shows a decrease in the thickness due to the light-induced crosslinking. As the thickness of the resulting film linearly decreases from the original thickness (prior to being crosslinked), it becomes possible to estimate the thickness of the polymer film after being crosslinked. Accordingly, the thickness of the underlayer including crosslinked polymer may be controlled.

(3) The film obtained according to the manner set forth in section (1) is washed to prepare a PS-OH monolayer film having a thickness of 16.7 nm. The monolayer film thus obtained is exposed to a UV light having a wavelength of about 254 nm at a light intensity of 20 J/cm$^2$ to obtain a crosslinked polymer monolayer film. The crosslinked polymer monolayer film has a thickness of 12.9 nm (see FIGS. 2(C) and (D)). The results confirm that the thickness of the monolayer film decreases very slightly.

(4) The aforementioned results confirm that the thickness of the underlayer film may be readily controlled, and the underlayer film with such a controlled thickness may have an effect on the period and the orientation degree of the directed self-assembly of the block copolymer.

Example 2

Figure 3:
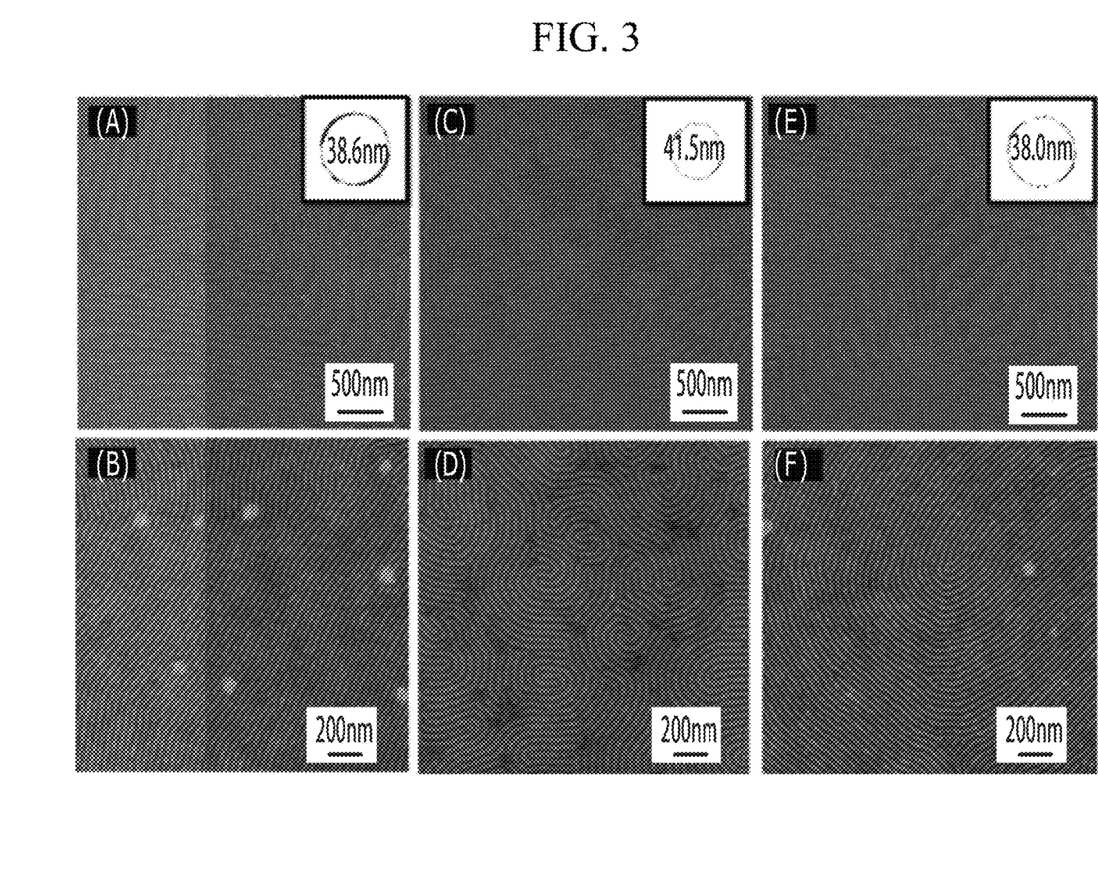
FIG. 3(A) to (F) are Scanning Electron Microscopy ("SEM") images of self-assembled products of polystyrene-polymethylmethacrylate ("PS-PMMA") block copolymers formed on a silicon substrate ((A) and (B)), a non-crosslinked polystyrene ("PS") underlayer ((C) and (D)), and a crosslinked PS underlayer ((E) and (F)), respectively.

Self-Assembly of the Block Copolymer on the Crosslinked Polymer Underlayer (1) An 8-inch silicon wafer substrate is cleaned, and then a toluene solution of a polystyrene-polymethylmethacrylate block copolymer (hereinafter, PS-b-PMMA, molecular weight: 46 k-21 k) having a concentration of 0.7 weight % is spin-coated at 4,000 rpm thereon to form a block copolymer ("BCP") layer having a thickness of 30 nm. The BCP layer is heat-treated at a temperature of 280° C. for 60 minutes to form an array of half cylinders of PS-b-PMMA. The results are shown in FIGS. 3(A) and (B), confirming that the pattern period of the discrete domains is 36.8 nm.

(2) An 8-inch silicon wafer substrate is cleaned, and then a toluene solution of hydroxyl-terminated polystyrene (hereinafter, PS-OH, molecular weight: 33 kg/mol, purchased from Polymer Science, Inc.) having a concentration of 1.0 weight % is spin-coated thereon at 1,000 rpm. The resulting wafer is heat-treated at a temperature of 150° C. for 6 hours and then washed with toluene to prepare a PS-OH monolayer film with a thickness of 16.7 nm. On the monolayer film, a toluene solution of polystyrene-polymethylmethacrylate block copolymer (hereinafter, PS-b-PMMA, molecular weight: 46 k-21 k) having a concentration of 0.7 weight % is spin-coated at 4,000 rpm thereon to form a BCP layer having a thickness of 30 nm. The BCP layer is heat-treated at a temperature of 280° C. for 60 minutes to form an array of half cylinders of PS-b-PMMA. The results are shown in FIGS. 3(C) and (D), confirming that the pattern period of the discrete domains is 41.5 nm.

(3) An 8-inch silicon wafer substrate is cleaned, and then a toluene solution of hydroxyl-terminated polystyrene (a molecular weight: 33 kg/mol, purchased from Polymer Science, Inc.) having a concentration of 1.0 weight % is spin-coated thereon at 1,000 rpm. The resulting wafer is heat-treated at a temperature of 150° C. for 6 hours and washed with toluene to prepare a PS-OH monolayer film with a thickness 16.7 nm. The monolayer film is exposed to a UV light having a wavelength of about 254 nm at a light intensity of 20 J/cm$^2$ to obtain a crosslinked polymer monolayer film having a thickness of 12.9 nm. On the monolayer film of the crosslinked polymer, an array of half cylinders of PS-b-PMMA is formed in the same manner as set forth in section (2). The results are shown in FIGS. 3(E) and (F), confirming that the pattern period of the discrete domains is 38.0 nm.

(4) The results of the aforementioned self-assembly of the BCP confirm that the self-assembled product of the block copolymer formed on the crosslinked PS underlayer has substantially the same period as the self-assembled product of the block copolymer formed on the bare silicon substrate. By contrast, the self-assembled product of the block copolymer formed on the non-crosslinked PS underlayer has a longer period of 41.5 nm, and it may be assumed that this is because the hydroxyl terminated polystyrene remaining on the substrate and not being anchored thereto is inter-mixed with the block copolymer.

In addition, comparison of the results as shown in FIGS. 3(C)/(D) and (E)/(F) reveals that the block copolymer self-assembled product formed on the crosslinked PS has a much longer correlation length than that of the block copolymer self-assembled product formed on the non-crosslinked PS. As used herein, the term "correlation length" refers to the stretched length of the self-assembled product (e.g., cylinders). It may be assumed that such results arise from the fact that no intermixing between the polymer of the underlayer and the block copolymer occurs on the crosslinked PS underlayer, and the crosslinking may change the surface energy of the underlayer. The longer the correlation length is, the less the defect number may be when the block copolymer is subjected to the directed self-assembly via graphoepitaxy.

Example 3

Directed Self-Assembly Product of the Block Copolymer on the Topography Pattern (I)

An 8-inch silicon wafer substrate is cleaned, a positive photoresist is spin-coated on the substrate at 2,500 rpm, and then the obtained substrate is pre-baked. Using a KrF scanner, the photoresist is exposed to light and then is baked and developed to prepare a photoresist pattern. By using the photoresist pattern as a mask, reactive ion etching is carried out to prepare a Si trench pattern (trench width: 280 nm and 380 nm, trench depth: 30 nm), and then the photoresist pattern is removed therefrom.

Figure 4:
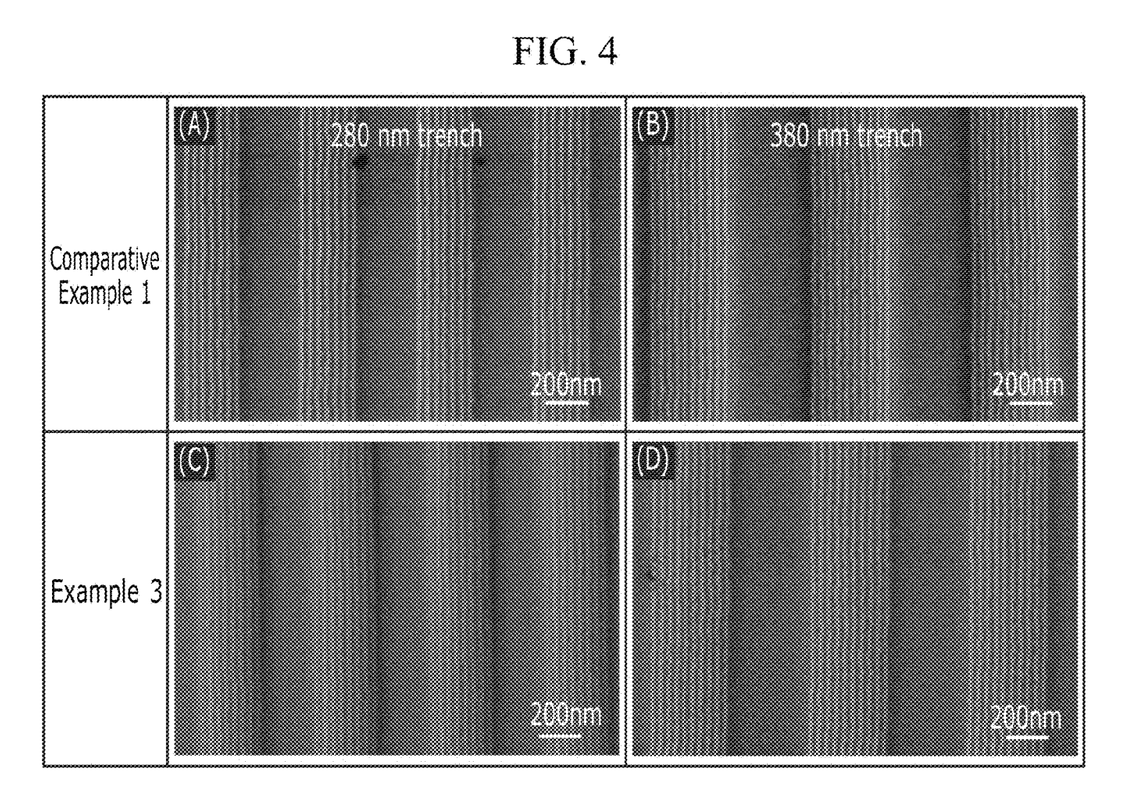
FIG. 4(A) to (D) are SEM images of directed self-assembly products of PS-PMMA formed in the trench of the topographic pattern in accordance with Comparative Example 1 and Example 3, respectively.

The Si trench pattern is subjected to ultrasonic wave cleaning in acetone and then is exposed to UV ozone for 20 minutes. On the cleaned Si trench pattern, a toluene solution of hydroxyl-terminated polystyrene (molecular weight: 33 kg/mol, purchased from Polymer Science, Inc.) having a concentration of 1.0 weight % is spin-coated thereon at 1,000 rpm and then is heat-treated at a temperature of 150° C. for 6 hours and washed with toluene to prepare a PS-OH monolayer film. The monolayer film is exposed to a UV light having a wavelength of 254 nm at a light intensity of 20 J/cm$^2$ to obtain a crosslinked polymer monolayer film. On the monolayer film of the crosslinked polymer, a toluene solution of polystyrene-polymethylmethacrylate block copolymer (hereinafter, PS-b-PMMA, molecular weight: 46 k-21 k) is spin-coated at 4,000 rpm thereon for 60 seconds to form a BCP layer having a thickness of 14 nm. The BCP layer is heat-treated at a temperature of 280° C. for 100 minutes to form a pattern of horizontal cylinder structures. FIGS. 4(C) and (D) show the electron microscopic images of the obtained pattern, confirming that the cylinder pattern may be formed with no defect.

Comparative Example 1

A BCP directed self-assembly pattern is obtained in the same manner as set forth in Example 3, except for using a non-crosslinked PS monolayer as the underlayer. Results are shown in FIGS. 4(A) and (B). When being compared with the pattern formed on the crosslinked PS underlayer, the pattern obtained in this comparative example is confirmed to have more defects in a wide trench.

Example 4

Directed Self-Assembly Product of the Block Copolymer on the Topography Pattern (II)

Figure 5:
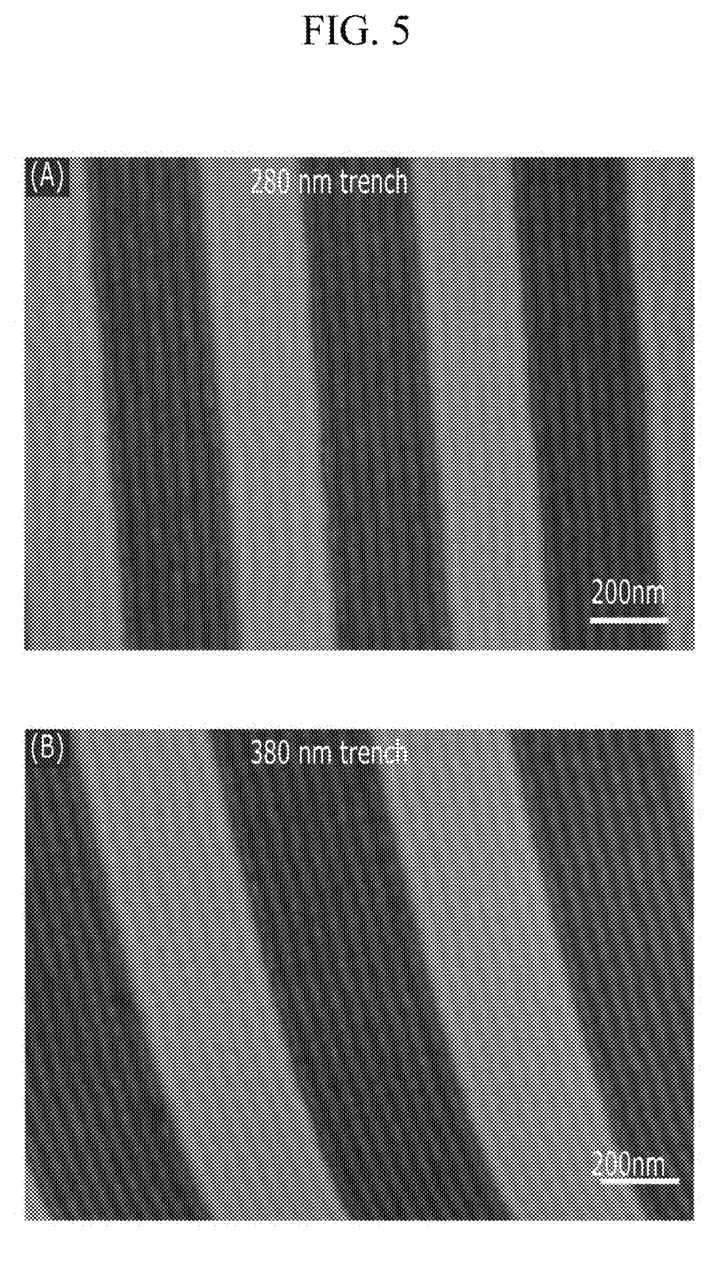

A BCP directed self-assembly pattern is obtained in the same manner as set forth in Example 3, except that a toluene solution of polystyrene-polymethylmethacrylate block copolymer (hereinafter, PS-b-PMMA, molecular weight: 46 k-21 k) is spin-coated at 4,000 rpm on the crosslinked PS underlayer for 60 seconds to form a BCP layer having a thickness of 30 nm thereon. The results are shown in FIG. 5. FIG. 5 shows that a well-defined pattern of the monolayer of BCP cylinder structures is formed not only in the trench but also on the mesa. When a conventional polymer brush is used, the pattern of self-assembled BCP is obtained only in the trench. However, using the underlayer of the main chain-crosslinked polymer may bring forth a directed self-assembly structure over the entire surface of the topographic pattern including trenches and mesas.

Example 5

Figure 6:
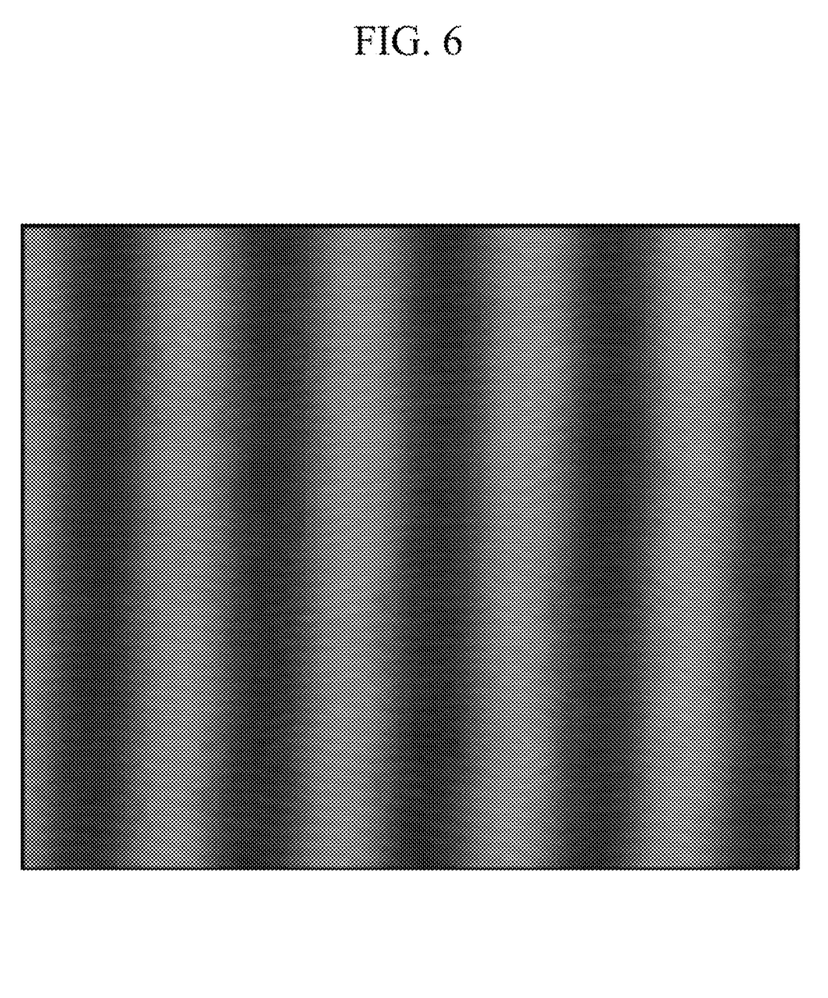
FIG. 6 shows a SEM image of directed self-assembly products of PS-PMMA formed on a thick underlayer of the crosslinked PS in accordance with Example 5, confirming that a pattern of the self-assembled product is formed as directed in a direction orthogonal to the topography pattern.

Formation of Self-Assembly Product Pattern of the Block Copolymer Directed in a Direction Orthogonal to the Topographic Pattern A BCP directed self-assembly pattern is obtained in the same manner as set forth in Example 3, except that a Si guide pattern having a trench depth of 40 nm is used, the thickness of the underlayer before being crosslinked is adjusted to 61.5 nm, and the underlayer is irradiated with a UV light without being washed with toluene to form an underlayer having a thickness of about 43 nm in the trench (i.e., having substantially the same thickness as the trench thickness). The SEM image of the obtained pattern is shown in FIG. 6. FIG. 6 confirms that a pattern of a BCP self-assembled product (cylinder) is formed in a direction orthogonal to the topographic pattern.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of patterning a block copolymer layer, the method comprising:
   providing a substrate comprising a topographic pattern on a surface of the substrate, wherein the topographic pattern comprises a trench and a mesa;
   forming, on the surface of the substrate, an underlayer comprising a polymer, having an anchoring group, wherein the polymer consists of a first repeating unit derived from a substituted or unsubstituted aromatic vinyl monomer or a combination of the first repeating unit and a second repeating unit derived from at least one non-aromatic vinyl monomer selected from a substituted or unsubstituted C1 to C10 alkyl(meth)acrylate, and a substituted or unsubstituted C6 to C20 aryl(meth) acrylate;
   heat-treating the underlayer to anchor the underlayer to the surface of the substrate via the anchoring group;
   irradiating the heat-treated underlayer with light to form a crosslinked polymer with a crosslink between carbon atoms of main chains of the polymer, wherein an aromatic group of the first repeating unit is directly linked to a main chain carbon atom of the polymer;
   forming a block copolymer layer on the underlayer comprising the crosslinked polymer; and
   heat-treating the block copolymer layer to form a self-assembled structure of the block copolymer directed by the topographic pattern,
   wherein the light in the irradiating the heat-treated underlayer is a UV light having a wavelength of shorter than or equal to about 300 nanometers,
   wherein the anchoring group is selected from a hydroxyl group, a thiol group, an azide group, a carboxylic acid group, an amide group, an amine group, or a trichlorosilane group, and
   wherein the anchoring group is disposed at a main chain carbon atom of the terminal end of the polymer.

2. The method of claim 1, wherein the polymer in the underlayer comprises a repeating unit derived from a vinyl monomer comprising a substituted or unsubstituted benzene moiety, a substituted or unsubstituted naphthalene moiety, a substituted or unsubstituted anthracene moiety, a substituted or unsubstituted pyridine moiety, a substituted or unsubstituted pyrrole moiety, a substituted or unsubstituted furan moiety, or a substituted or unsubstituted thiophene moiety.

3. The method of claim 1, wherein the polymer in the underlayer comprises a repeating unit derived from a substituted or unsubstituted styrene, a substituted or unsubstituted vinyl naphthalene, a substituted or unsubstituted vinylanthracene, a substituted or unsubstituted vinylpyridine, a substituted or unsubstituted vinylpyrrole, a substituted or unsubstituted vinylfuran, a substituted or unsubstituted vinylthiophene, or a combination thereof.

4. The method of claim 1, wherein the polymer in the underlayer comprises a repeating unit derived from styrene, a C1 to C10 alkyl substituted styrene, a halogen substituted styrene, 1-vinylpyrrole, 2-vinylpyrrole, 3-vinylpyrrole, 2-vinylpyridine, 4-vinylpyridine, 2-vinylfuran, 3-vinylfuran, 2-vinylthiophene, 3-vinylthiophene, or a combination thereof.

5. The method of claim 1, wherein the polymer in the underlayer is a homopolymer, a random copolymer, or a block copolymer.

6. The method of claim 1, wherein the polymer in the underlayer is a hydroxy-terminated polystyrene, a hydroxy-terminated poly(methylstyrene), a hydroxy-terminated poly(ethylstyrene), a hydroxy-terminated poly(4-t-butylstyrene), a hydroxy-terminated poly(chlorostyrene), a hydroxy-terminated poly(2-vinylpyridine), a hydroxy-terminated poly(4-vinylpyridine), a hydroxy-terminated poly(1-vinylpyrrole), a hydroxy-terminated poly(2-vinylpyrrole), a hydroxy-terminated poly(vinylpyrrole), a hydroxy-terminated poly(methylmethacrylate-co-styrene) random copolymer, a hydroxy-terminated poly(styrene-co-vinylpyridine) random copolymer, a hydroxy-terminated poly(methylmethacrylate-co-vinylpyridine) random copolymer, or a combination thereof.

7. The method of claim 1, wherein the heat-treating the underlayer is conducted at a temperature of greater than or equal to about 80° C. for about 30 minutes or longer.

8. The method of claim 1, further comprising
   washing the heat-treated underlayer with an organic solvent prior to the irradiating the heat-treated underlayer with light.

9. The method of claim 8, wherein the organic solvent is a C6 to C20 aromatic hydrocarbon, a C5 to C10 aliphatic hydrocarbon, a ketone, or a combination thereof.

10. The method of claim 1, wherein the irradiating the heat-treated underlayer with light is conducted at a light intensity of greater than or equal to about 10 Joules/centimeter$^2$.

11. The method of claim 1, wherein the block copolymer comprises
   a block copolymer comprising a first repeating unit comprising styrene or a derivative thereof and a second repeating unit comprising (meth)acrylic acid ester,
   a block copolymer comprising a first repeating unit comprising styrene or a derivative thereof and a second repeating unit comprising siloxane or a derivative thereof,
   a block copolymer comprising a first repeating unit comprising styrene or a derivative thereof and a second repeating unit comprising an olefin, or a block copolymer comprising a first repeating unit comprising styrene or a derivative thereof and a second repeating unit comprising an alkylene oxide.

12. The method of claim 1, wherein the block copolymer self-assembled by the heat-treating of the block copolymer layer comprises a cylinder structure parallel to the substrate or a lamella structure perpendicular to the substrate.

13. The method of claim 1, wherein a thickness of the block copolymer layer is greater than or equal to 15 nanometers so that a self-assembled structure of the block copolymer is directed by the topographic pattern both in the trench and on the mesa.

14. The method of claim 1, wherein a thickness of the underlayer is substantially equal to a depth of the trench so that a self-assembly of the block copolymer is directed in a direction orthogonal to the topographic pattern.

15. A patterned polymer structure including
a substrate,
an underlayer disposed on a surface of the substrate, and
a block copolymer layer patterned on the underlayer,
wherein the underlayer comprises a crosslinked polymer consisting of a first repeating unit derived from a substituted or unsubstituted aromatic vinyl monomer or a combination of the first repeating unit and a second repeating unit derived from at least one non-aromatic vinyl monomer selected from a substituted or unsubstituted C1 to C10 alkyl(meth)acrylate, and a substituted or unsubstituted C6 to C20 aryl(meth)acrylate, the crosslinked polymer is linked to the substrate via a moiety derived from an anchoring group, wherein the crosslinked polymer comprises a crosslink between carbon atoms of a main chain of the polymer, and an aromatic group of the first repeating unit is directly linked to a carbon atom of the main chain of the polymer, wherein the anchoring group is selected from a hydroxyl group, a thiol group, an azide group, a carboxylic acid group, an amide group, an amine group, or a trichlorosilane group, and wherein the anchoring group is disposed at a main chain carbon atom of the terminal end of the polymer.

* * * * *